(12) United States Patent
Eckblad et al.

(10) Patent No.: US 6,390,475 B1
(45) Date of Patent: May 21, 2002

(54) ELECTRO-MECHANICAL HEAT SINK GASKET FOR SHOCK AND VIBRATION PROTECTION AND EMI SUPPRESSION ON AN EXPOSED DIE

(75) Inventors: Michael Z. Eckblad, Auburn; Russell S. Aoki, Kent, both of WA (US); Chia-Pin Chiu, Chandler; Correy D. Cooks, Phoenix, both of AZ (US); Richard Zhao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/387,048

(22) Filed: Aug. 31, 1999

(51) Int. Cl.[7] .............................. F16J 15/02; F28F 7/00; H01L 23/34; H05K 7/20
(52) U.S. Cl. ........................ 277/312; 277/628; 277/915; 277/919; 165/80.3; 257/719; 361/704
(58) Field of Search ............................ 277/628, 650, 277/915, 919, 312, 315, 316; 165/185, 80.3; 361/704, 705; 257/713, 719, 720

(56) References Cited

U.S. PATENT DOCUMENTS

| 4,207,604 A | * | 6/1980 | Bell |
| 4,764,797 A | * | 8/1988 | Shaw et al. |
| 4,814,857 A | * | 3/1989 | Werbizky |
| 4,865,716 A | * | 9/1989 | Sibbald et al. |
| 4,879,629 A | * | 11/1989 | Tustaniwskyj et al. |
| 4,900,877 A | * | 2/1990 | Dubrow et al. |
| 4,954,878 A | * | 9/1990 | Fox et al. |
| 5,184,211 A | * | 2/1993 | Fox |
| 5,528,462 A | * | 6/1996 | Pendse |
| 5,680,057 A | * | 10/1997 | Johnson |
| 5,793,104 A | * | 8/1998 | Kirkman |
| 5,825,634 A | * | 10/1998 | Moorehead, Jr. |
| 6,610,705 | * | 12/2000 | Stearns et al. |
| 6,285,075 B1 | * | 9/2001 | Combs et al. |

FOREIGN PATENT DOCUMENTS

EP 340959 * 5/1988

* cited by examiner

Primary Examiner—Anthony Knight
Assistant Examiner—Vishal Patel
(74) Attorney, Agent, or Firm—Antonelli, Terry, Stout & Kraus, LLP

(57) ABSTRACT

A method and assembly for utilizing a gasket to protect an exposed die from damage, such as chipping and cracking, caused by external forces such as shock, vibrations, installation and/or handling, as well as to prevent electromagnetic interference (EMI) emissions from the exposed die.

24 Claims, 4 Drawing Sheets

ELECTRO-MECHANICAL HEAT SINK GASKET FOR SHOCK AND VIBRATION PROTECTION AND EMI SUPPRESSION ON AN EXPOSED DIE

FIELD

The invention relates to a method and assembly for utilizing a gasket to protect an exposed die from damage, such as fracturing, chipping and cracking, caused by external forces such as shock, vibrations, installation and/or handling, and to suppress electromagnetic interference emissions from the exposed die.

BACKGROUND

When assembling an electronic package or integrated circuit (IC) device which includes an exposed die having electrical circuits, one approach to cooling is when a heat sink is "die referenced", that is, placed directly upon the surface of the exposed die. However, although the heat sink is provided for thermal protection of the die, the placement of the heat sink on the die can result in physical damage to the die, and consequently a deterioration in the performance of the circuit device.

Therefore, unless the heat sink is placed carefully and squarely upon the die, the heat sink can tilt on the surface of the die, thus rendering the die vulnerable to chipping and/or cracking on the corner thereof. Such damage to the die can also occur when the heat sink itself is installed during assembly, and when the die is not coplanar with the top surface of the die.

FIG. 2 shows an example of improper placement of a heat sink on an exposed die. When the heat sink 50 is placed upon the exposed die 10 (mounted on a substrate 20) at an angle as depicted in the drawing, the heat sink 50 tilts on the surface of the exposed die 10, thus fracturing, chipping or cracking the corner of the die.

FIG. 3A shows an example of a chipped corner of an exposed die, whereby chips of silicon are forcefully broken off when the heat sink is placed upon the exposed die in an uneven manner. As set forth above, such fracturing often occurs in the corner of the die. However, the die is equally vulnerable to scratching and chipping on the top surface thereof as well. Furthermore, such fracturing can be caused by shock and vibrations applied to the apparatus or housing of the electronics package which includes the exposed die. The standard for ensuring proper implementation of the exposed die, and therefore ensuring proper functionality of the corresponding circuit device, requires that fractures, chips, scratches and other forms of damage must be less than a testing standard which can include, but not be limited to, 5 mils. FIG. 3B shows a properly protected die in which only pre-existing weak spots are shown, typically less than 5 mils. Conversely, FIG. 4 shows a die subjected to shock and vibration testing having unacceptable levels of fracturing, chipping and cracking, measuring up to 6 mils×9 mils.

Shock and vibration testing of electronic and electro-mechanical devices having circuit boards therein was conducted to simulate the environments in which such devices are utilized, including automobiles, aircrafts, etc. The results of such testing are shown in Table A.

TABLE A

| Configurations | | |
|---|---|---|
| Interface | Gasket | Max. Crack Size |
| T210-A0 | Bare | 25 mils |
| T443 | Bare | 32 mils |
| T710 | Bare | 10 mils |
| T443 | APM gasket | 3.5 mils |
| T710 | APM gasket | 2.5 mils |
| T443 | APM gasket | 14 mils |
| T710 | APM gasket | <2.5 mil |
| T443 | Chomerics gasket | <1 mil |

The results of "bare" testing, in which the exposed die has a heat sink applied thereon, utilizing any of interface materials including the Thermagon Corp. (Cleveland, Ohio) T210-A0, the Chomerics Corp. (Woburn, Mass.) T443 the Chomerics Corp. T710, are shown in the first three rows of results in Table A. The results of "bare" testing show unacceptable levels of cracking and other damage of no less than 10 mils. As set forth above, 5 mils is the maximum allowable amount of damage, including fracturing, chipping, cracking and scratching of the die, to ensure proper functioning of the corresponding circuit device. In addition, in the "bare" testing, pieces of silicon broke off of the dies and were thrown about the interior of the chassis, which clearly presents a threat to operating conditions of any electronics or electro-mechanical device.

In addition, the exposed die is likely to produce EMI radiation which adversely compromises the circuit and/or neighboring equipment. Currently, there are no means for suppressing EMI emissions at the die level. Further, there is no implementation for directly attaching a heat sink to an exposed die, or "die referencing" the heat sink, in such a manner that suppresses EMI emissions at die level.

SUMMARY

According to the invention, a conductive gasket having a central opening is placed on a substrate surface to fit over an exposed die. The gasket is then compressed by a heat sink until the bottom surface of the heat sink contacts with the exposed die.

BRIEF DESCRIPTION OF THE DRAWINGS

The scope of the present invention will be apparent from the following detailed description, when taken in conjunction with the accompanying drawings, and such detailed description, while indicating example embodiments of the invention, are given as illustrations only, since various changes and modifications within the spirit and scope of the invention will become apparent to those skilled in the art from this detailed description, in which.

DETAILED DESCRIPTION

Figure 1A:
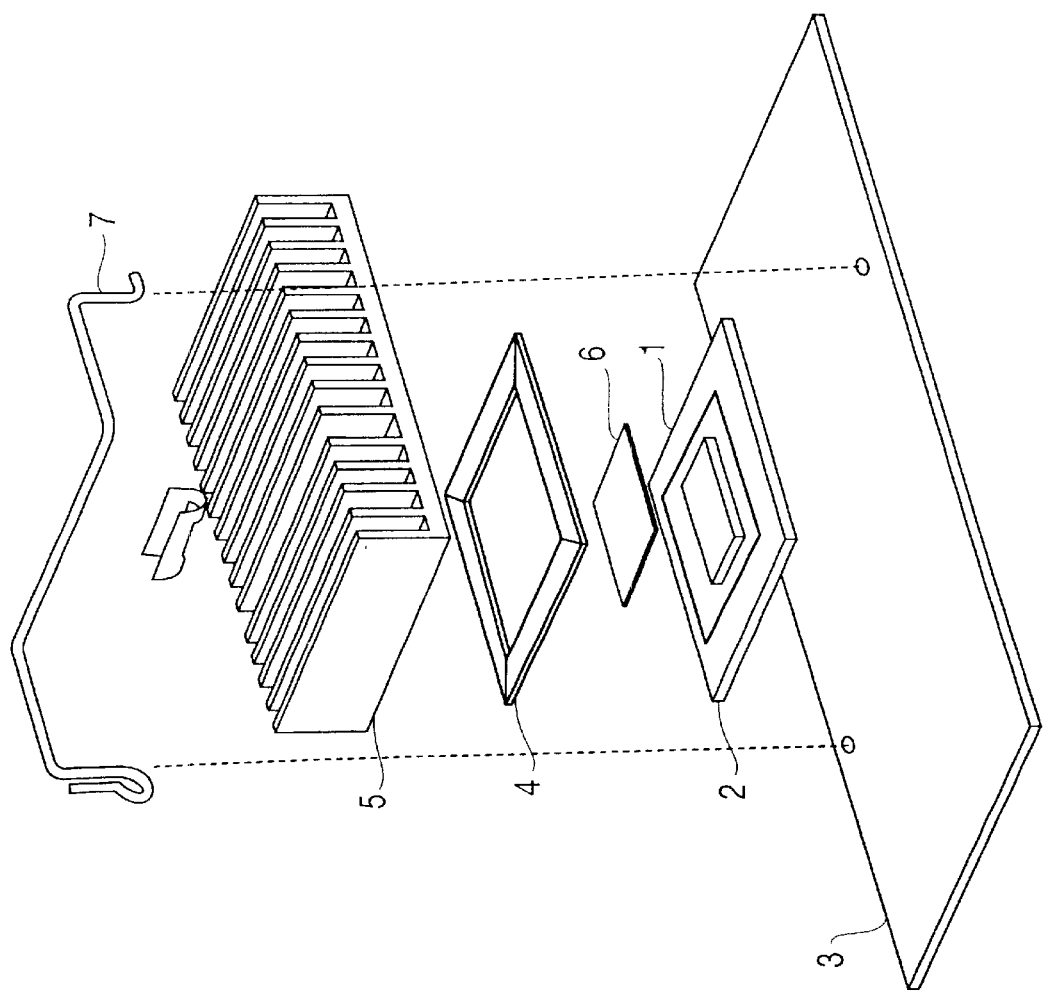
FIG. 1A shows an example of a Heat Sink-Gasket assembly of the present invention.

FIG. 1A shows an example assembly utilizing a gasket 4 to suppress electromagnetic interference (EMI) from an exposed die 1 and to further protect the exposed die 1 from damage thereto, including fracturing, chipping and cracking, caused by external forces, such as shock and vibrations, applied to the die itself or the electronic package in which the die is disposed.

For the sake of the present discussion, the description of the present invention is applied to, but is certainly not limited to, an exposed die applied on a substrate surface utilizing an organic land grid array (OLGA) and OLGA gaskets which are appropriate for such an array.

Figure 5:
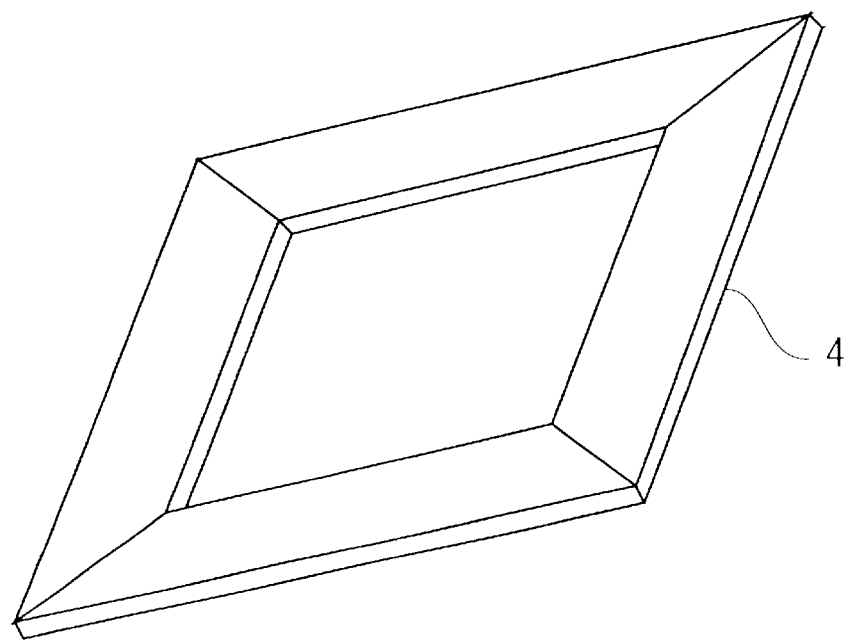
FIG. 5 shows an example of an organic land grid array (OLGA) "picture frame" gasket used in an example Heat Sink-Gasket assembly according to the invention.
Figure 3A:
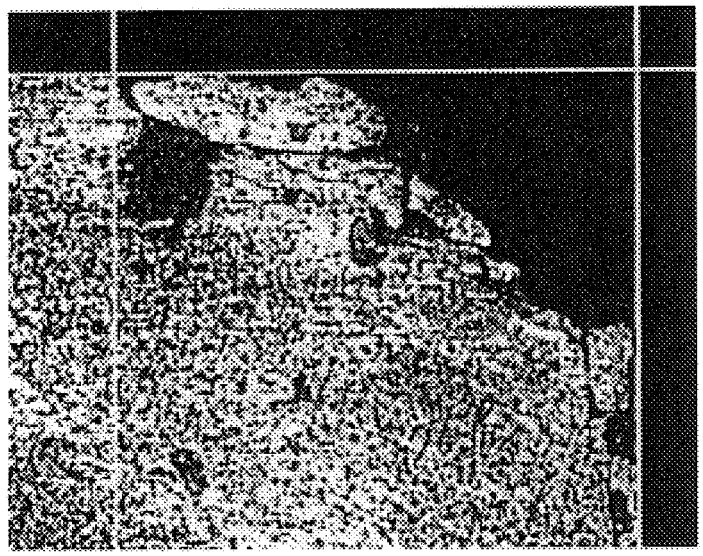
FIG. 3A shows an example of a damaged die resulting from improper alignment of a die reference heat sink in cooperation with an exposed die.
Figure 3B:
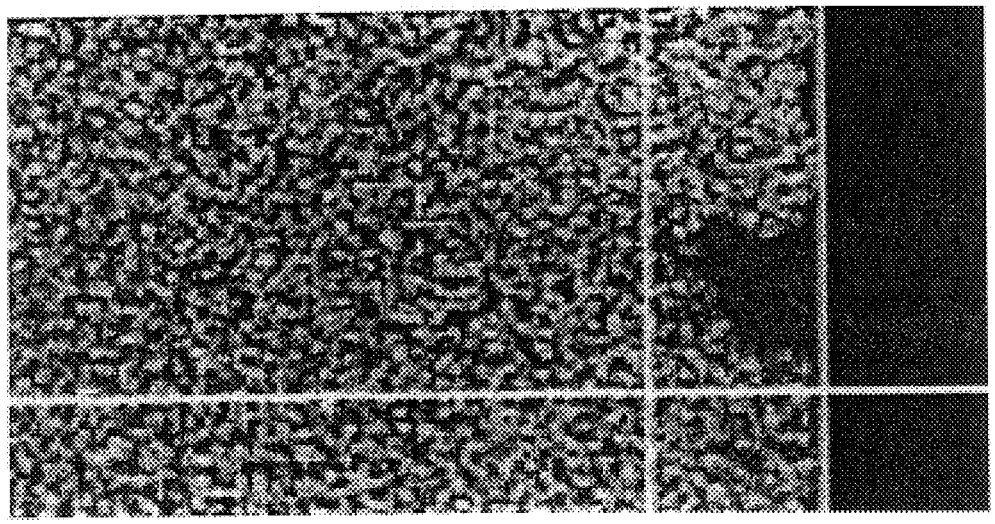
FIG. 3B shows an example of a properly protected die, resulting from proper alignment of a die reference heat sink in cooperation with an exposed die.

As shown in FIG. 5, an OLGA gasket is configured to "frame" an exposed die. The gasket is made of a non-conductive material including rubber or polyurethane and is at least partially covered by a fine mesh conductive material, including, but not limited to, carbon. Examples of such gaskets types are the Chomerics Corp. Softshield 5000, and the Vanguard Corp. (Danbury, Conn.) Ultra Vanshield. Other manufacturers include the APM Corp. (Harrisburg, Pa.), the Boyd Corp. (Pleasanton, Calif.), and the Schlegel Corp. (Rochester, N.Y.).

Furthermore, such gaskets are either die cut or are manufactured by configuring four separate or partially attached pieces of the conductive material into a "picture frame" configuration with a central opening so as to accommodate the exposed die therein, as in FIG. 5.

Testing of an OLGA gaskets has been conducted to determine optimal dimensional configurations to substantially eliminate fracturing, chipping, cracking, scratches and other forms of damage to an exposed die which is "framed" by a gasket, limiting such damage to less than 5 mils when the gasket and die are subjected to shock and vibration testing, and to substantially eliminate EMI emissions from the exposed die. As set forth above, 5 mils has been determined to be the allowable threshold in order to maintain the integrity of the structure of the die and optimal operation thereof, although such standard is variable according to manufacture.

The shock and vibration testing was applied to exposed dies having heat sinks applied thereon with various pressure sensitive adhesives (PSA), interface materials and gaskets placed between the heat sink and the substrate surface. The PSAs are provided to eliminate slippage and retain the gasket to the heat sink, and the interface materials are provided to assist in conducting heat from the exposed die to the heat sink. Specifically, the shock and vibration testing included mounting a substrate to 0.75" PEM Corp. (Dansboro, Pa.) standoffs and applying a shock of 50 g's in addition to random vibrations. Such testing is crucial since many electronics and electro-mechanical devices in which processors having circuit devices are subjected to external forces, such as shock and vibration, resulting from installation or the environment, including applications in automobile, aircrafts, etc.

Table A includes the results of shock and vibration testing applied to exposed lies. In the shock and vibration testing, the exposed die and heat: sink were subjected to shock and vibrations having no gasket placed between the substrate surface and the heat sink ("bare"), an APM Corp. gasket placed between the substrate surface and the heal sink (APM gasket) or a Chomerics Corp. gasket placed between the substrate surface and the heat sink.

Figure 4:
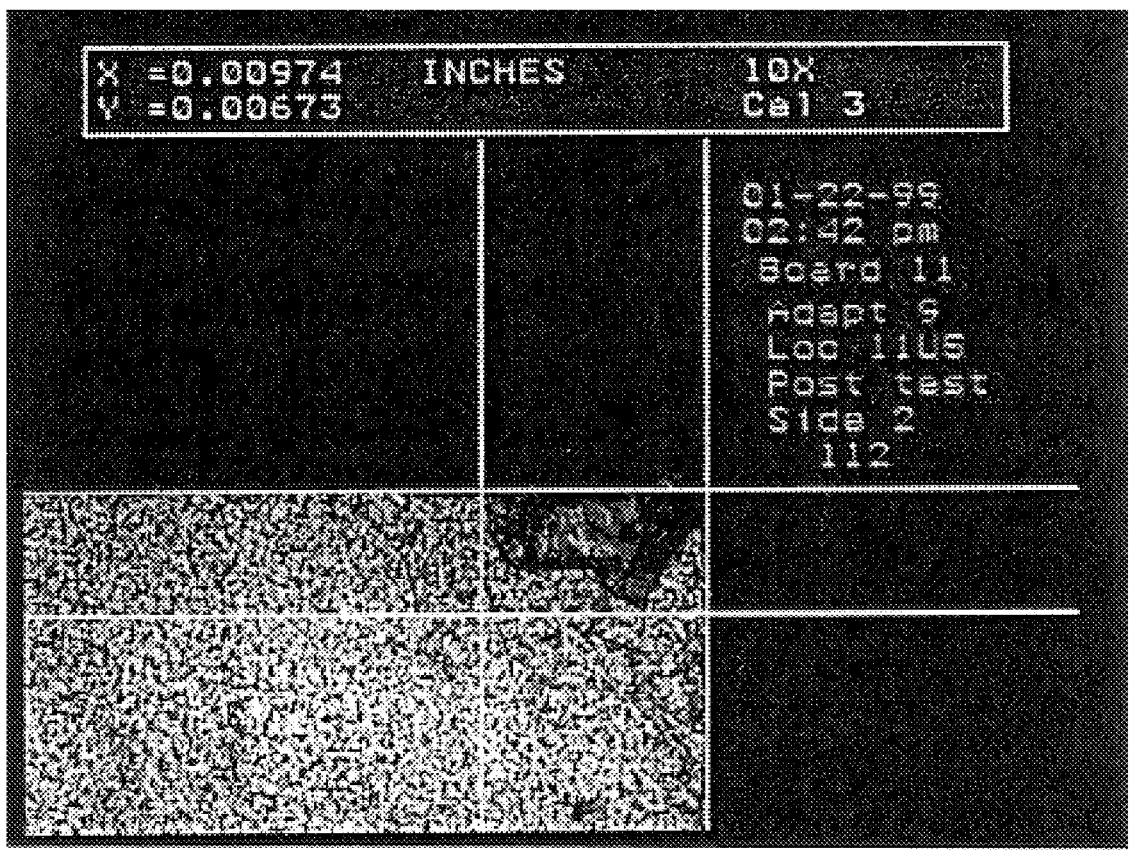
FIG. 4 shows an example of a damaged die subjected to shock and vibration testing.

As seen in Table A, it has been determined that a Chomerics Corp. gasket measuring 0.039" in height with a Chomerics T710 interface material is the optimal manufacturing standard to prevent fracturing, chipping, cracking and scratching of the die, or at least keep the extent of such damage to the structure or surface of the die to less than 5 mils, in electromechanical devices subjected to shock and vibration testing up to 50 g's along all axes three times in both the positive and negative directions and 0.5 g sine sweep of 0–500 Hz along all axes. In addition, it was shown that a die cut gasket subjected to the testing conditions described above allows unacceptable levels fracturing, exceeding 5 mils, of the exposed die, as shown in FIG. 4. Therefore, a "picture frame" Chomerics gasket, as shown in FIG. 5 for example, having a pre-compression height of approximate 0.04" which is greater than the height of the die has been considered an optimal standard to prevent fracturing, chipping, cracking and scratching of the exposed die, exceeding 5 mils. The "picture frame" gasket is made by configuring outer sides of the perimeter of the gasket to each measure approximately 1.2" in order so that the standard heat sink can rest substantially squarely upon the gasket. The internal perimeter of the gasket, which defines the central opening of the gasket that accommodates the exposed die, measures approximately 0.75" along each side. The measurements described above are merely example measurements, utilized in cooperation with standard heat sinks and dies, though the dimensions of the gasket can be easily changed to accommodate heat sinks and dies having varying dimensions.

Therefore, as shown in FIG. 1A, the present invention includes gasket 4 which is configured, as shown for example in FIG. 5, to "frame" the exposed die 1, allowing the heat sink 5 to contact both the gasket 4 and die 1 simultaneously, after the heat sink 5 has compressed the gasket 4. Thus, after the exposed die 1 has been placed upon the substrate surface 2, the gasket 4 is also placed upon the substrate surface 2, with the substantially central opening of the gasket 4 laterally surrounding the exposed die 1. The gasket has a height which is greater than that of the exposed die before the gasket is compressed, the preferred height of the gasket before compression thereof being approximately 0.039", which is greater than the standard die which has a height of approximately 0.033".

Furthermore, the gasket 4 has "bi-linear stiffness" so as to be compressible to ensure optimal contact between the heat sink 5 and the exposed die 4, thus providing optimal thermal performance. "Bi-linear stiffness" refers to the rigidity of the gasket, requiring an amount of force for compressing the gasket a unit distance to change to a higher value after the gasket has been compressed to substantially equal the height of the exposed die by the heat sink. Such compressibility is essential for the gasket 4 since heat sinks are not all uniformly manufactured. That is, the gasket must be compressible so that even an asymmetrical heat sink is able to uniformly contact the exposed die to stabilize the heat sink 5 upon the exposed die 1, thereby protecting the die surface and structure and further suppressing EMI emission from the die.

Gasket 4 is able to be adhered to the bottom surface of the a heat sink 5, for simpler displacement of the heat sink 5 and gasket 4 on the exposed die 1.

FIG. 1A further includes the interface material 6, which is provided to assist in heat conduction from the exposed die 1 to the heat sink 5. The interface 6 is a conductive material that provides optimal heat conduction to the heat sink 5 by eliminating air gaps between the exposed die 1 and the heat sink 5 caused by imperfections in the manufacture of either the die or the heat sink.

As a result of the configuration of the exposed die 1 upon the substrate surface 2, the gasket 4 on the substrate surface 2 so as to frame the exposed die 1, the interface material 6 on the exposed die 1, and the heat sink 5 on the gasket 4 and die 1, as shown in FIG. 1A, the gasket 4 dampens or absorbs the velocity and displacements effects of shocks and vibrations by the heat sink 5 on the exposed die 1 since the heat sink 5 is resting squarely on the exposed die 1 and compressed gasket 4 simultaneously. In addition, the gasket 4 prevents the heat sink 5 from tilting on the surface of the exposed die, thus preventing fracturing, chipping, cracking and/or scratching of the corners and/or surface of the exposed die 1 caused by uneven placement of the heat sink 5 on the die 1. Thus, not only is damage to the exposed die prevented, but also the performance of neighboring circuits is not compromised by chipped portions of a damaged die floating throughout the processor area, since the exposed die is confined unilaterally.

Figure 1B:
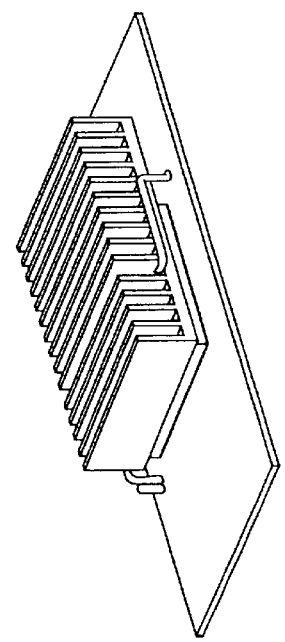
FIG. 1B shows the cooperative assembly of an example of elements in FIG. 1A.
Figure 2:
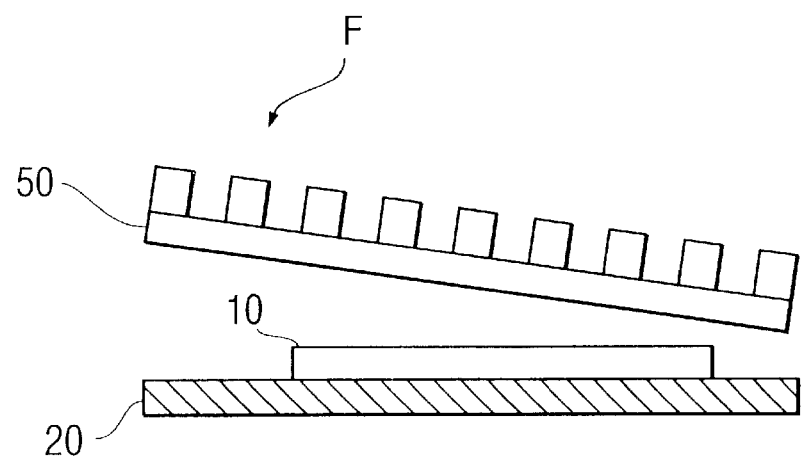
FIG. 2 shows a die reference heat sink in cooperation with an exposed die.

FIG. 1B shows an example of a composite assembly of the elements shown in FIG. 1A, held in place by spring clip 7, thus providing a protective environment for the exposed die 1 in which the integrity of the surface and structure of the die is maintained.

Furthermore, by the example configuration shown in FIG. 1A, EMI emissions from the exposed die 1 are suppressed. That is, by placing gasket 4, which is made at least partially of a conductive material, between the substrate surface 2 and the bottom surface of the heat sink 5, a "faraday cage" is created around the exposed die, which is grounded through the substrate surface 2 by a ground ring 3 or specific ground contact points on the substrate surface 2. A "faraday cage" is a shield or a barrier which confines EMI emissions therein. Further, at least the bottom portion of the heat sink 5 is made at least partially of a conductive material, and a conductive ring is provided on the substrate surface 2. Therefore the emission of EMI from the exposed die 1 is suppressed unilaterally.

The suppression of EMI emissions from the exposed die 1 is crucial since such EMI emissions could compromise the performance of neighboring circuits. As a result, EMI emission suppression is treated at the die level, as opposed to conventional treatment thereof at the casing or housing level.

While the present invention has been described in detail and pictorially in the accompanying drawings, it is not limited to such details since many changes and modifications may be made thereto without departing from the spirit and scope of the present invention. It is intended that all such modifications fall within the scope of the following claims.

We claim:

1. A method for protecting an exposed die mounted on a substrate surface from structural damage caused by external forces, said method comprising the steps of:
    placing a gasket on said substrate surface, wherein said gasket has an opening which fits over said exposed die, and wherein said gasket has a greater height than said exposed die when said gasket is in a non-compressed state;
    concurrently or subsequently to said placing of said gasket, placing a die reference heat sink over said gasket and said exposed die such that said heat sink is not in contact with said exposed die; and
    compressing said gasket with said die reference heat sink to reduce the height of said gasket until a bottom surface of said heat sink contacts with a top surface of said exposed die.

2. A method according to claim 1, wherein said gasket is adhered to a bottom surface of said heat sink.

3. A method according to claim 1, wherein said gasket assists in absorbing any shocks and vibrations applied to said exposed die.

4. A method according to claim 1, wherein said gasket is made of a material having bi-linear stiffness, wherein an amount of force for compressing the gasket a unit distance changes to a higher value after the gasket has been compressed to substantially equal the height of the exposed die by the heat sink.

5. A method according to claim 1, wherein said gasket is at least partially made of an electrically conductive material.

6. A method according to claim 5, wherein said gasket and said heat sink, in combination with a ground ring in said substrate surface, provide a barrier surrounding said exposed die to eliminate electromagnetic interference (EMI) emissions from said exposed die.

7. A heat sink-gasket assembly, comprising:
    a die reference heat sink;
    a gasket;
    an exposed die mounted on a substrate surface;
        wherein said gasket has a central opening to fit over said exposed die on said substrate surface such that said gasket has a height greater than said exposed die when said gasket is in a non-compressed state; and
        wherein said gasket is compressed by said heat sink from a position where the heat sink is out of contact with said exposed die to a position reducing the height of said gasket until said heat sink contacts with a top surface of said exposed die.

8. A heat sink-gasket assembly according to claim 7, wherein said gasket is adhered to a bottom surface of said heat sink.

9. A heat-sink assembly according to claim 7, wherein said gasket assists in attenuating any shocks and vibrations applied to said exposed die.

10. A heat sink-gasket assembly according to claim 7, wherein said gasket is made of a material having bi-linear stiffness, wherein an amount of force for compressing the gasket a unit distance changes to a higher value after the gasket has been compressed to substantially equal the height of the exposed die by the heat sink.

11. A heat sink-gasket assembly according to claim 7, wherein said gasket is at least partially made of an electrically conductive material.

12. A heat sink-gasket assembly according to claim 11, wherein said gasket and said heat sink, in combination with a ground ring or ground points in said substrate surface, provide a barrier surrounding said exposed die to eliminate electromagnetic interference (EMI) emissions from said exposed die.

13. An electromagnetic interference emissions suppressing system for an exposed die, comprising:
    a substrate surface upon which said exposed die is placed;
    a gasket having an opening which fits over said exposed die, said gasket having a greater height that that of said exposed die in a non-compressed state;
    a die reference heat sink; and
        wherein said gasket in combination with said substrate surface and said heat sink, forms a barrier to suppress electromagnetic interference (EMI) emissions from said exposed die, and wherein said gasket is compressed by said heat sink from a position where the heat sink is out of contact with said exposed die to a position reducing the height of said gasket until said heat sink contacts with a top surface of said exposed die.

14. A system according to claim 13, wherein said gasket is at least partially made of an electrically conductive material.

15. A system according to claim 13, wherein said gasket is compressed between said substrate surface and said heat sink until said heat sink contacts with said exposed die.

16. A system according to claim 13, wherein said gasket is attached to a bottom surface of said heat sink.

17. A system according to claim 13, wherein said gasket assists in absorbing any shocks and vibrations applied to said exposed die.

18. A system according to claim 13, wherein said gasket has bi-linear stiffness, wherein an amount of force for compressing the gasket a unit distance changes to a higher value after the gasket has been compressed to substantially equal the height of the exposed die by the heat sink.

19. A method for reducing EMI emissions from an exposed die mounted on a substrate surface, said method comprising the steps of:

placing a gasket on said substrate surface, said gasket having an opening which fits over said exposed die, and said gasket having a greater height than that of said exposed die when said gasket is in a non-compressed state;

concurrently or subsequently to said placing of said gasket, placing a die reference heat sink over said gasket and said die such that said heat sink is not in contact with said exposed die; and compressing said gasket with a bottom surface of said die reference heat sink to reduce the height of said gasket until the bottom surface of said heat sink contacts said exposed die.

20. A method according to claim 19, wherein said surface substrate, said gasket and said heat sink form a barrier to suppress EMI emission from said exposed die.

21. A method according to claim 19, wherein said gasket is at least partially made of an electrically conductive material.

22. A method according to claim 19, wherein said gasket is attached to a bottom surface of said heat sink.

23. A method according to claim 19, wherein said gasket absorbs any shocks and vibrations applied to said exposed die.

24. A method according to claim 19, wherein said gasket has bi-linear stiffness, wherein an amount of force for compressing the gasket a unit distance changes to a higher value after the gasket has been compressed to substantially equal the height of the exposed die by the heat sink.

* * * * *